United States Patent
Wang et al.

(10) Patent No.: US 10,727,451 B2
(45) Date of Patent: Jul. 28, 2020

(54) DISPLAY SUBSTRATE AND MANUFACTURING METHOD THEREOF, AND DISPLAY DEVICE

(71) Applicant: BOE TECHNOLOGY GROUP CO., LTD., Beijing (CN)

(72) Inventors: Dongfang Wang, Beijing (CN); Tongshang Su, Beijing (CN); Leilei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/426,468

(22) Filed: May 30, 2019

(65) Prior Publication Data

US 2020/0099013 A1 Mar. 26, 2020

(30) Foreign Application Priority Data

Sep. 25, 2018 (CN) .......................... 2018 1 1113916

(51) Int. Cl.
*H01L 33/42* (2010.01)
*H01L 51/56* (2006.01)
(Continued)

(52) U.S. Cl.
CPC ........ *H01L 51/56* (2013.01); *H01L 27/14601* (2013.01); *H01L 27/322* (2013.01); *H01L 27/3241* (2013.01); *H01L 33/42* (2013.01); *H01L 51/5206* (2013.01); *H01L 51/5221* (2013.01)

(58) Field of Classification Search
None
See application file for complete search history.

(56) References Cited

U.S. PATENT DOCUMENTS 10,431,774 B2 10/2019 Lai et al.
2011/0241000 A1 10/2011 Choi et al.
(Continued)

FOREIGN PATENT DOCUMENTS

| CN | 104966723 A | 10/2015 |
| CN | 107994059 A | 5/2018 |
| CN | 108539049 A | 9/2018 |

OTHER PUBLICATIONS

Chinese Office Action in Chinese Application No. 201811113916.2, dated Feb. 3, 2020 with English translation.

*Primary Examiner* — Cheung Lee
(74) *Attorney, Agent, or Firm* — Collard & Roe, P.C.

(57) ABSTRACT

A display substrate and a manufacturing method thereof, and a display device are provided. The manufacturing method of the display substrate includes: forming light emitting units of at least two colors on a base substrate, which includes: forming a first electrode, a light emitting layer and a second electrode on the base substrate. An electrode sub-layer and a transparent structure are formed on the base substrate to form the first electrode. A first transparent conductive layer, a transparent etching barrier layer and a second transparent conductive layer are formed on a side of the electrode sub-layer away from the base substrate to form the transparent structure of the first color light emitting unit. An etching rate of the first transparent conductive layer and an etching rate of the second transparent conductive layer are substantially identical, and thicknesses of transparent structures in different light emitting units are different.

19 Claims, 4 Drawing Sheets

(51) Int. Cl.
  *H01L 27/32* (2006.01)
  *H01L 51/52* (2006.01)
  *H01L 27/146* (2006.01)

(56) References Cited

U.S. PATENT DOCUMENTS

2012/0168755 A1 7/2012 Choi
2017/0187001 A1 6/2017 Fang et al.

DISPLAY SUBSTRATE AND MANUFACTURING METHOD THEREOF, AND DISPLAY DEVICE

The present application claims priority of Chinese Patent Application No. 201811113916.2, filed on Sep. 25, 2018, the disclosure of which is incorporated herein by reference in its entirety as part of the present application.

TECHNICAL FIELD

At least one embodiment of the present disclosure relates to a display substrate and a manufacturing method thereof, and a display substrate.

BACKGROUND

Organic light emitting diode (OLED) displays have become a research hotpots due to their advantages such as self-luminous, high contrast, thin thickness, fast response, bendability, wide temperature range, and the like.

SUMMARY

At least one embodiment of the present disclosure provides a display substrate, a manufacturing method thereof, and a display device.

At least one embodiment of the present disclosure provides a manufacturing method of a display substrate, comprising: forming light emitting units of at least two colors on a base substrate, forming the light emitting units of the at least two colors comprising: forming a first electrode on the base substrate; forming a light emitting layer on a side of the first electrode away from the base substrate; and forming a second electrode on a side of the light emitting layer away from the first electrode. A method of forming the first electrode comprises sequentially forming an electrode sub-layer and a transparent structure on the base substrate; one of the electrode sub-layer and the second electrode is a reflective electrode, the other of the electrode sub-layer and the second electrode is a transflective electrode, and thicknesses of transparent structures in the light emitting units of the at least two colors are different such that a distance between the electrode sub-layer and the second electrode is different in different light emitting units of the at least two colors; the light emitting units of the at least two colors comprise a first color light emitting unit, and a method of forming the transparent structure of the first color light emitting unit comprises: sequentially forming a first transparent conductive layer, a transparent etching barrier layer and a second transparent conductive layer, that are stacked with each other, on a side of the electrode sub-layer of the first color light emitting unit away from the base substrate, an etching rate of the first transparent conductive layer and an etching rate of the second transparent conductive layer being substantially identical.

For example, the light emitting layer and the second electrode are conformal structures formed on the transparent structures having different thicknesses.

For example, the light emitting units of the at least two colors further comprise a second color light emitting unit, the transparent structure of the second color light emitting unit comprises a third transparent conductive layer and a fourth transparent conductive layer which are stacked and in contact with each other, and a method of forming the transparent structure of the first color light emitting unit and the transparent structure of the second color light emitting unit comprises: forming the first transparent conductive layer and the third transparent conductive layer in a same process; forming the transparent etching barrier layer on a side of the first transparent conductive layer and a side of the third transparent conductive layer away from the base substrate, and patterning the transparent etching barrier layer to form an opening exposing the third transparent conductive layer; forming a transparent conductive film on a side of the transparent etching barrier layer that is patterned and a side of the third transparent conductive layer away from the base substrate. A first portion of the transparent conductive film directly above the first transparent conductive layer is the second transparent conductive layer, and a second portion of the transparent conductive film directly above the third transparent conductive layer is the fourth transparent conductive layer.

For example, a method of forming the first transparent conductive layer and the third transparent conductive layer in the same process comprises: forming the first transparent conductive layer and the third transparent conductive layer that are spaced apart from each other by using a same patterning process; after forming the transparent conductive film, the manufacturing method comprises: patterning the transparent conductive film and the transparent etching barrier layer that is patterned, to retain a first portion of the transparent etching barrier layer on the first transparent conductive layer, forming the second transparent conductive layer on the first portion of the transparent etching barrier layer that is retained, and forming the fourth transparent conductive layer on the third transparent conductive layer.

For example, the light emitting units of the at least two colors further comprise a third color light emitting unit, and the transparent structure of the third color light emitting unit comprises a fifth transparent conductive layer, while forming the first transparent conductive layer and the third transparent conductive layer, the manufacturing method further comprises: forming the fifth transparent conductive layer; while forming the second transparent conductive layer and the fourth transparent conductive layer, the manufacturing method further comprises: removing a second portion of the transparent etching barrier layer and a third portion of the transparent conductive film on the fifth transparent conductive layer to expose the fifth transparent conductive layer, the transparent etching barrier layer being configured to prevent the fifth transparent conductive layer from being etched.

For example, while patterning the transparent etching barrier layer to form an opening, the manufacturing method further comprises: forming a via hole penetrating the transparent etching barrier layer in the transparent etching barrier layer on the first transparent conductive layer to electrically connect the second transparent conductive layer to be subsequently formed with the first transparent conductive layer.

For example, the transparent etching barrier layer is formed by a chemical vapor deposition method.

For example, the light emitting layer is a white light emitting layer.

For example, a material of the first transparent conductive layer and a material of the second transparent conductive layer comprise indium tin oxide, gallium zinc oxide, zinc oxide or indium zinc oxide, and a material of the transparent etching barrier layer comprises silicon oxide, silicon nitride or silicon oxynitride.

For example, the material of the first transparent conductive layer and the material of the second transparent conductive layer are identical.

For example, a thickness of the first transparent conductive layer is 80-300 angstroms, a thickness of the transparent etching barrier layer is 80-500 angstroms, and a thickness of the second transparent conductive layer is 120-900 angstroms.

At least one embodiment of the present disclosure provides a display substrate, comprising: a base substrate; and light emitting units of at least two colors on the base substrate. The light emitting units of the at least two colors comprise a first electrode, a light emitting layer and a second electrode, that are stacked, on the base substrate, the first electrode comprises an electrode sub-layer and a transparent structure on a side of the electrode sub-layer away from the base substrate, one of the electrode sub-layer and the second electrode is a reflective electrode, the other of the electrode sub-layer and the second electrode is a transflective electrode, and thicknesses of transparent structures in the light emitting units of the at least two colors are different such that a distance between the electrode sub-layer and the second electrode is different in different light emitting units of the at least two colors; the light emitting units of the at least two colors comprise a first color light emitting unit, the transparent structure of the first color light emitting unit comprises: a first transparent conductive layer, a transparent etching barrier layer and a second transparent conductive layer, that are stacked with each other, on a side of the electrode sub-layer away from the base substrate, and an etching rate of the first transparent conductive layer and an etching rate of the second transparent conductive layer being substantially identical.

For example, the light emitting units of the at least two colors further comprise a second color light emitting unit, the transparent structure of the second color light emitting unit comprises a third transparent conductive layer and a fourth transparent conductive layer which are stacked and in contact with each other, the third transparent conductive layer and the first transparent conductive layer are formed in a same process, and the fourth transparent conductive layer and the second transparent conductive layer are formed in a same process.

For example, the light emitting units of the at least two colors further comprise a third color light emitting unit, and the transparent structure of the third color light emitting unit comprises a fifth transparent conductive layer, and the fifth transparent conductive layer and the first transparent conductive layer are formed in a same process.

For example, a material of the first transparent conductive layer and a material of the second transparent conductive layer both comprise indium tin oxide, gallium zinc oxide, zinc oxide or indium zinc oxide, and a material of the transparent etching barrier layer comprises silicon oxide, silicon nitride or silicon oxynitride.

For example, the material of the first transparent conductive layer and the material of the second transparent conductive layer are identical.

For example, the transparent etching barrier layer comprises a via hole penetrating the transparent etching barrier layer to electrically connect the second transparent conductive layer with the first transparent conductive layer.

For example, the light emitting layer is a white light emitting layer, and the display substrate further comprises a color film layer on a side of the light emitting units away from the base substrate.

At least one embodiment of the present disclosure provides a display device, comprising the display substrate according to any one of the above examples.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
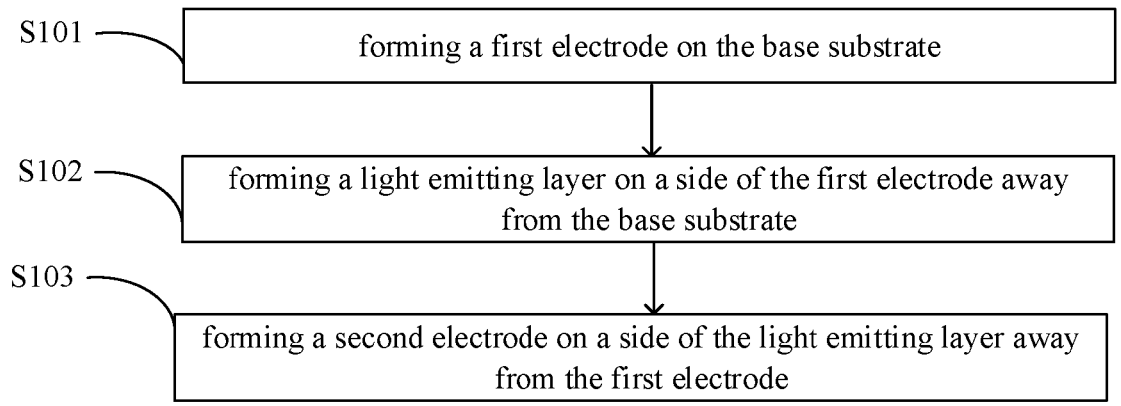
FIG. 1 is a schematic flow chart of a manufacturing method of a display substrate according to an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

In general, high color gamut requirements of organic light emitting diodes can be achieved by a microcavity resonance effect. By adjusting an optical length of a dielectric layer between a reflective electrode and a transflective electrode, photons emitted from a light emitting layer can interfere with each other between the reflective electrode and the transflective electrode, causing constructive or destructive interference, thereby emitting out light of a specific wavelength. For example, transparent conductive layers having different thicknesses can be formed on the reflective electrode according to different color requirements, the original multi-wavelength white light turns into three primary color of red, green and blue by adjusting optical lengths (such as thicknesses) of the transparent conductive layers, finally, the saturable three primary colors are obtained by a color filtering method. The light emitted from the light emitting layer is reflected on a surface at a side of the reflective electrode facing the light emitting layer, and reflectance of the reflective electrode is about 95%. And after the light emitted from the light emitting layer is incident on the transflective electrode, the light reflected by a surface at a side of the transflective electrode facing the light emitting layer, the light emitted from the light emitting layer and the light reflected by the reflective electrode cause constructive or destructive interference, the light that produces constructive interference is enhanced and transmitted from the transflective electrode, so as to achieve emitting out the light of a specific wavelength.

In research, the inventors of the present application found that a material of the transparent conductive layer on the reflective electrode may be indium tin oxide (ITO). In a case that indium tin oxide layers having different thicknesses are formed, a first indium tin oxide layer is formed on the reflective electrode, and then at least one indium tin oxide layer is deposited on the first indium tin oxide layer, and finally a plurality of indium tin oxide layers are etched to form transparent conductive layers having different thicknesses. Alternatively, a relative thick indium tin oxide layer is formed on the reflective electrode, and then the relative thick indium tin oxide layer is etched to form the transparent conductive layers having different thicknesses. However, when the plurality of indium tin oxide layers are etched or the relative thick indium tin oxide layer is etched to obtain the transparent conductive layers having different thicknesses, the indium tin oxide layer that needs to be retained is also etched, so that the indium tin oxide layer that needs to be retained is damaged and the surface flatness of the indium tin oxide layer that is retained is relatively low.

At least one embodiment of the present disclosure provides a display substrate and a manufacturing method thereof, and a display device. The manufacturing method of the display substrate comprises: forming light emitting units of at least two colors on a base substrate, and forming the light emitting units of the at least two colors comprising: forming a first electrode on the base substrate; forming a light emitting layer on a side of the first electrode away from the base substrate; and forming a second electrode on a side of the light emitting layer away from the first electrode. The method of forming the first electrode comprises sequentially forming an electrode sub-layer and a transparent structure on the base substrate. The light emitting units of the at least two colors comprise a first color light emitting unit, and a method of forming the transparent structure of the first color light emitting unit comprises: sequentially forming a first transparent conductive layer, a transparent etching barrier layer and a second transparent conductive layer, that are stacked with each other, on a side of the electrode sub-layer away from the base substrate, an etching rate of the first transparent conductive layer and an etching rate of the second transparent conductive layer are substantially identical. One of the electrode sub-layer and the second electrode is a reflective electrode, and the other of the electrode sub-layer and the second electrode is a transflective electrode, and thicknesses of transparent structures in the light emitting units of the at least two colors are different such that a distance between the electrode sub-layer and the second electrode is different in different light emitting units of the at least two colors. Because the etching rate of the first transparent conductive layer and the etching rate of the second transparent conductive layer are substantially identical, by forming the transparent etching barrier layer, damage to the transparent conductive layer on the side of the transparent etching barrier layer facing the base substrate can be prevented upon forming the transparent structures having different thicknesses in the light emitting units of different colors.

The display substrate, the manufacturing method thereof, and the display device are described below with reference to the accompanying drawings.

At least one embodiment of the present disclosure provides a manufacturing method of a display substrate, FIG. 1 is a schematic flow chart of a manufacturing method of a display substrate according to at least one embodiment. FIGS. 2A-2K are schematic process flow diagrams of a display substrate according to an example of at least one embodiment. As shown in FIG. 1, the manufacturing method of the display substrate provided in this embodiment includes forming light emitting units of at least two colors on a base substrate, and forming the light emitting units of the at least two colors on the base substrate includes the following steps.

S101: forming a first electrode on the base substrate;
S102: forming a light emitting layer on a side of the first electrode away from the base substrate; and
S103: forming a second electrode on a side of the light emitting layer away from the first electrode.

In the step S101, forming the first electrode includes sequentially forming an electrode sub-layer and a transparent structure on the base substrate. The light emitting units of the at least two colors include a first color light emitting unit, and forming a transparent structure of the first color light emitting unit includes: sequentially forming a first transparent conductive layer, a transparent etching barrier layer and a second transparent conductive layer, that are stacked with each other, on a side of the electrode sub-layer away from the base substrate, an etching rate of the first transparent conductive layer and an etching rate of the second transparent conductive layer are substantially identical.

In the steps S102 and S103, one of the electrode sub-layer and the second electrode is a reflective electrode, the other of the electrode sub-layer and the second electrode is a transflective electrode, and thicknesses of transparent structures in the light emitting units of the at least two colors are different such that a distance between the electrode sub-layer and the second electrode of the light emitting units of one color is different from a distance between the electrode sub-layer and the second electrode of the light emitting units of the other color.

Figure 2A:
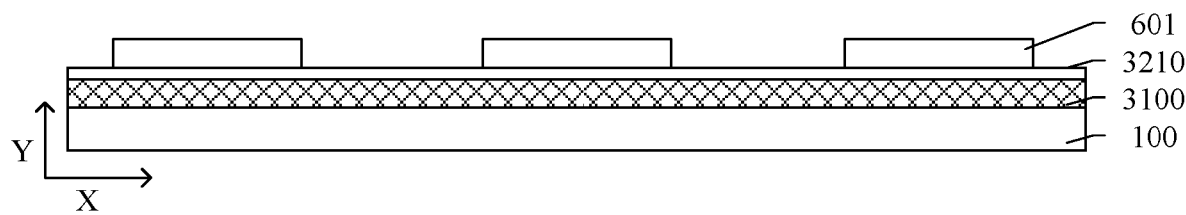
FIGS. 2A-2K are schematic process flow diagrams of a display substrate according to an example of an embodiment of the present disclosure.

For example, as shown in FIG. 2A, an electrode sub-layer material 3100 is formed on the base substrate 100.

For example, the electrode sub-layer material 3100 may include aluminum-neodymium alloy (AlNd), aluminum alloy, or silver alloy, and this embodiment is not limited thereto.

For example, a thickness of the electrode sub-layer material 3100 in a direction (a Y direction) perpendicular to the base substrate 100 is 100 nm to 200 nm.

For example, as shown in FIG. 2A, a first transparent conductive layer material 3210 is formed on a side of the electrode sub-layer material 3100 away from the base substrate 100.

Figure 2B:
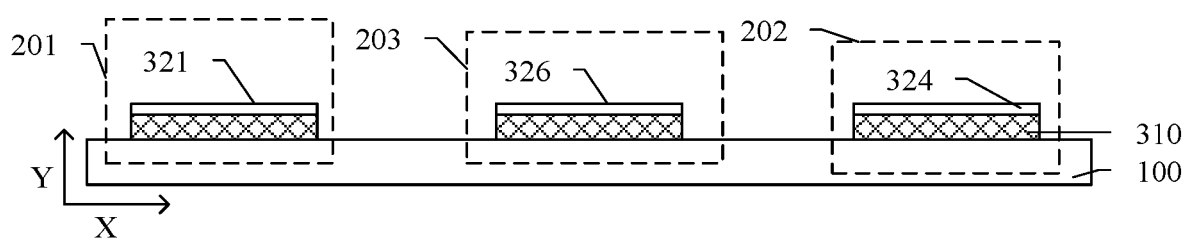

For example, as shown in FIG. 2A, a first photoresist pattern 601 is formed on the first transparent conductive layer material 3210, and the first transparent conductive layer material 3210 and the electrode sub-layer material 3100 are etched by using the first photoresist pattern 601 as a mask, and then the photoresist is stripped to obtain a structure shown in FIG. 2B.

For example, as shown in FIG. 2B, the electrode sub-layer material 3100 is patterned to form a plurality of electrode sub-layers 310 spaced apart from each other, that is, the electrode sub-layer material 3100 is patterned to form electrode sub-layers 310 of respective light emitting units.

For example, as shown in FIG. 2B, in an example of this embodiment, the electrode sub-layer material 3100 is patterned to form electrode sub-layers 310 of three color light emitting units 201, 202 and 203.

For example, as shown in FIG. 2B, the first transparent conductive layer material 3210 is patterned to form a plurality of transparent conductive layers spaced apart from each other. For example, the plurality of transparent conductive layers are spaced apart from each other in a direction parallel to the base substrate 100, such as an X direction and a direction perpendicular to the paper surface as shown in the drawings.

For example, as shown in FIG. 2B, in an example of this embodiment, the light emitting units of the at least two colors include a first color light emitting unit 201, a second color light emitting unit 202, and a third color light emitting unit 203. The first transparent conductive layer material 3210 is patterned to form a first transparent conductive layer 321 of the first color light emitting unit 201, a third transparent conductive layer 324 of the second color light emitting unit 202, and a fifth transparent conductive layer 326 of the third color light emitting unit 203, that is, the first transparent conductive layer 321 of the first color light emitting unit 201, the third transparent conductive layer 324 of the second color light emitting unit 202, and the fifth transparent conductive layer 326 of the third color light emitting unit 203 are formed in the same process, for example, the first transparent conductive layer 321, the third transparent conductive layer 324 and the fifth transparent conductive layer 326 are formed by patterning the same first transparent conductive layer material 3210 once.

For example, as shown in FIG. 2B, a thickness of the first transparent conductive layer 321, a thickness of the third transparent conductive layer 324, and a thickness of the fifth transparent conductive layer 326 all are the same. A material of the first transparent conductive layer 321, a material of the third transparent conductive layer 324, and a material of the fifth transparent conductive layer 326 all are the same.

For example, a material of the first transparent conductive layer 321, a material of the third transparent conductive layer 324, and a material of the fifth transparent conductive layer 326 include indium tin oxide, gallium zinc oxide, zinc oxide, indium zinc oxide or the like.

For example, in the Y direction, each of a thickness of the first transparent conductive layer 321, a thickness of the third transparent conductive layer 324, and a thickness of the fifth transparent conductive layer 326 is 80-300 angstroms.

For example, each of the thickness of the first transparent conductive layer 321, the thickness of the third transparent conductive layer 324, and the thickness of the fifth transparent conductive layer 326 is 100-200 angstroms.

Figure 2C:
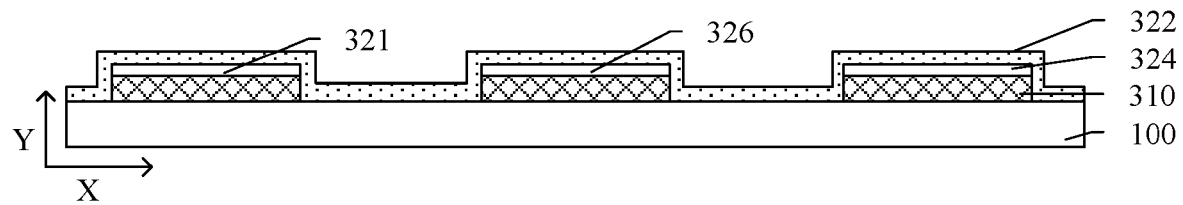

For example, as shown in FIG. 2C, a transparent etching barrier layer 322 is formed on a side of the first transparent conductive layer 321, the third transparent conductive layer 324 and the fifth transparent conductive layer 326 away from the base substrate 100.

For example, a material of the transparent etching barrier layer 322 includes silicon oxide, silicon nitride, silicon oxynitride, and the like, and the embodiment includes but is not limited thereto.

For example, in the Y direction, a thickness of the transparent etching barrier layer 322 is 80-500 angstroms.

For example, the thickness of the transparent etching barrier layer 322 is 100-200 angstroms.

For example, the transparent etching barrier layer 322 can be formed by using a chemical vapor deposition method.

Figure 2D:
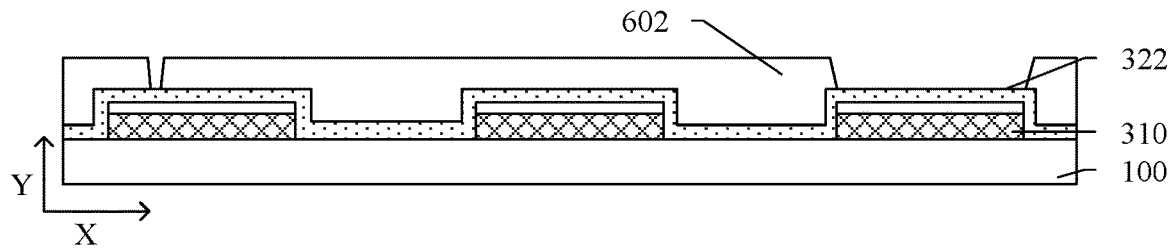
Figure 2E:
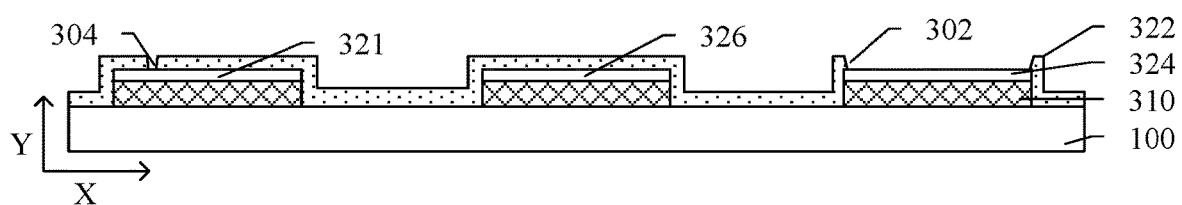

For example, as shown in FIG. 2D, a second photoresist pattern 602 is formed on the transparent etching barrier layer 322, and the transparent etching barrier layer 322 is etched by using the second photoresist pattern 602 as a mask to form an opening 302 and a via hole 304 (that is, a via hole penetrating the transparent etching barrier layer 322) shown in FIG. 2E in the transparent etching barrier layer 322, and then the photoresist is stripped to obtain a structure shown in FIG. 2E.

For example, as shown in FIG. 2E, the opening 302 included in the transparent etching barrier layer 322 is configured to expose the third transparent conductive layer 324, and the via hole 304 included in the transparent etching barrier layer 322 is configured to expose a portion of the first transparent conductive layer 321.

Figure 2F:
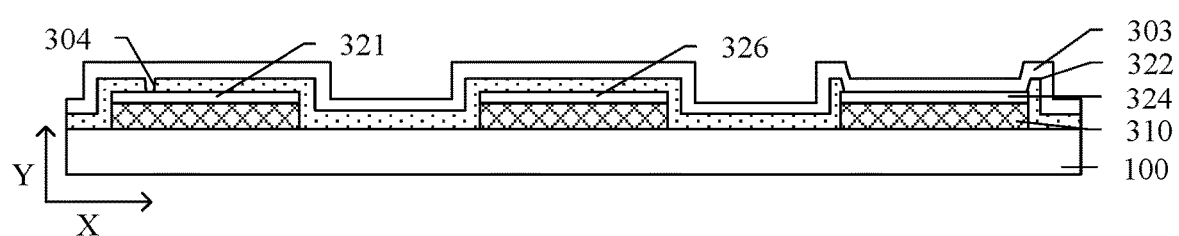

For example, as shown in FIG. 2F, a transparent conductive film 303 is formed on the side of the patterned transparent etching barrier layer 322 and the exposed third transparent conductive layer 324 away from the base substrate 100. The transparent conductive film 303 corresponding to the first transparent conductive layer 321 is electrically connected to the first transparent conductive layer 321 through the via hole 304, the transparent conductive film 303 corresponding to the third transparent conductive layer 324 is in contact with the third transparent conductive layer 324. That is, a first portion of the transparent conductive film 303 located directly above the first transparent conductive layer 321 (in the direction indicated by an arrow along the Y direction) is electrically connected to the first transparent conductive layer 321 through the via hole 304, and a second portion of the transparent conductive film 303 located directly above the third transparent conductive layer 324 is in contact with the third transparent conductive layer 324.

An etching rate of the transparent conductive film 303 in this embodiment is substantially the same as an etching rate of the first transparent conductive layer material 3210 (that is, the first transparent conductive layer 321, the third transparent conductive layer 324, and the fifth transparent conductive layer 326), "substantially the same" herein means that the etching rate of the transparent conductive film 303 and the etching rate of the first transparent conductive layer material 3210 are completely the same, or an etching rate difference between the etching rate of the transparent conductive film 303 and the etching rate of the first transparent conductive layer material 3210 is not more than 5%. The etching rate of the transparent conductive film 303 being substantially the same as the etching rate of the first transparent conductive layer material 3210 indicates that an etching selectivity ratio of the transparent conductive film 303 and the first transparent conductive layer material 3210 is substantially 1:1 under the same etching condition.

For example, a material of the transparent conductive film 303 is the same as a material of the first transparent conductive layer material 3210 such that the etching rate of the transparent conductive film 303 is the same as the etching rate of the first transparent conductive layer material 3210.

Figure 2G:
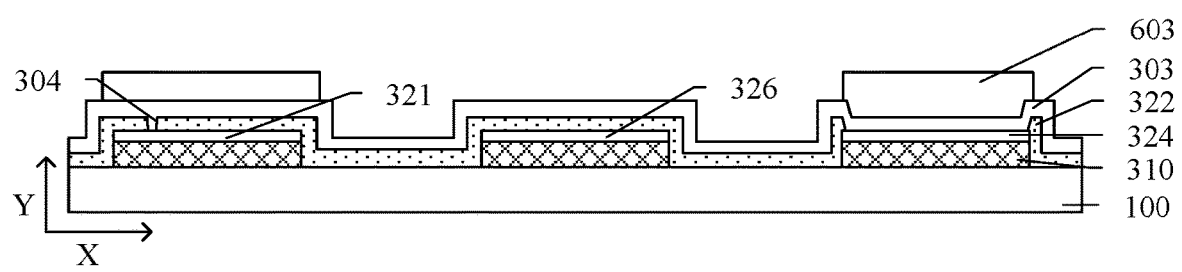
Figure 2H:
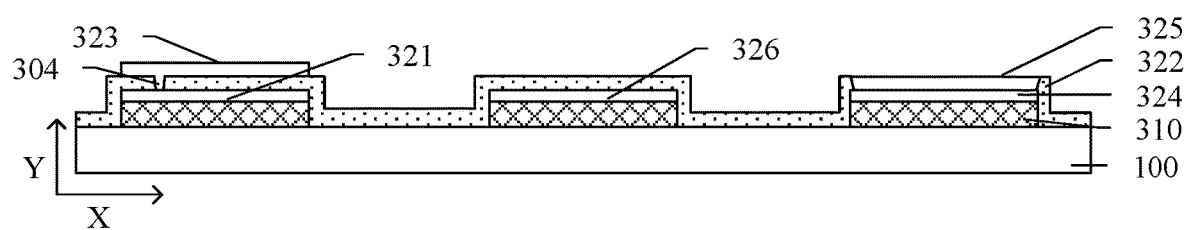

For example, as shown in FIG. 2G, a third photoresist pattern 603 is formed on the transparent conductive film 303, and the transparent conductive film 303 is etched by using the third photoresist pattern 603 as a mask to form a second transparent conductive layer 323 (the second transparent conductive layer 323 is electrically connected to the first transparent conductive layer 321 through the via hole 304) as shown in FIG. 2H on (directly on) the first transparent conductive layer 321, and to form a fourth transparent conductive layer 325 (the fourth transparent conductive layer 325 is in contact with the third transparent conductive layer 324) as shown in FIG. 2H on the third transparent conductive layer 324, and then the photoresist is stripped to form a structure shown in FIG. 2H.

In at least one embodiment of the present disclosure, because the etching rate of the transparent conductive film 303 and the etching rate of the fifth transparent conductive layer 326 are substantially the same, assuming that the transparent etching barrier layer 322 is not disposed between the transparent conductive film 303 and the fifth transparent conductive layer 326, upon the transparent conductive film 303 being etched, the fifth transparent conductive layer 326 is also adversely affected. Therefore, in at least one embodiment, through providing the transparent etching barrier layer 322 between the transparent conductive film 303 and the fifth transparent conductive layer 326, the fifth transparent conductive layer 326 may be prevented from being damaged upon the transparent conductive film 303 being etched. In this embodiment, in a process of forming transparent structures of different thicknesses in the light emitting units of different colors, that is, in a process of etching the transparent conductive film to form the second transparent conductive layer and the fourth transparent conductive layer, the transparent etching barrier layer can prevent damage to the transparent conductive layer located between the transparent etching barrier layer and the base substrate, for example, the transparent etching barrier layer can prevent damage to the fifth transparent conductive layer, so that a surface of the formed fifth transparent conductive layer is relatively flat.

For example, the second transparent conductive layer 323 of the first color light emitting unit and the fourth transparent conductive layer 325 of the second color light emitting unit are formed in the same process, for example, the second transparent conductive layer 323 of the first color light emitting unit and the fourth transparent conductive layer 325 of the second color light emitting unit are formed by patterning the same transparent conductive film 303 once.

For example, as shown in FIG. 2H, a material of the second transparent conductive layer 323 and a material of the fourth transparent conductive layer 325 are the same, and a thickness of the second transparent conductive layer 323 and a thickness of the fourth transparent conductive layer 325 are the same.

For example, both of the material of the second transparent conductive layer 323 and the material of the fourth transparent conductive layer 325 include indium tin oxide, gallium zinc oxide, zinc oxide, indium zinc oxide, and the like.

For example, in the Y direction, each of the thickness of the second transparent conductive layer 323 and the thickness of the fourth transparent conductive layer 325 is 120-900 angstroms.

For example, each of the thickness of the second transparent conductive layer 323 and the thickness of the fourth transparent conductive layer 325 is 300-700 angstroms.

Figure 2I:
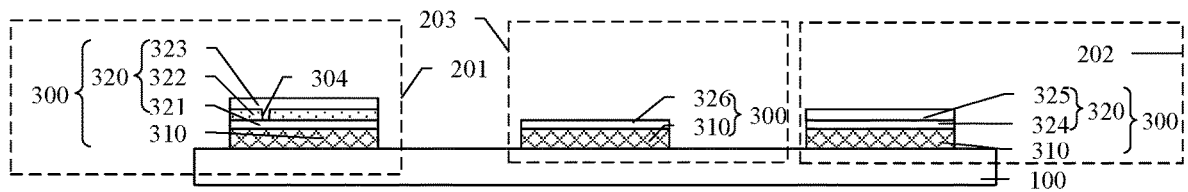

For example, as shown in FIG. 2I, the transparent etching barrier layer 322 is etched(wet etching or dry etching) to retain a portion of the transparent etching barrier layer 322 between the first transparent conductive layer 321 and the second transparent conductive layer 323, and to expose the fifth transparent conductive layer 326.

For example, this embodiment does not limit the steps illustrated by FIG. 2G to FIG. 2I, and the transparent conductive film 303 and the transparent etching barrier layer 322 are also respectively patterned by using the third photoresist pattern 603 as a mask, and then the photoresist is stripped to form the structure shown in FIG. 2I. That is, the transparent conductive film 303 and the transparent etching barrier layer 322 are patterned by using the same third photoresist pattern 603 as a mask.

It should be noted that FIGS. 2G-2I are merely schematic diagrams, and a pixel defining layer between adjacent light emitting units is omitted in the drawings.

For example, as shown in FIG. 2I, a transparent structure 320 of the first color light emitting unit 201 includes a first transparent conductive layer 321, a transparent etching barrier layer 322 and a second transparent conductive layer 323, the second transparent conductive layer 323 is electrically connected to the first transparent conductive layer 321 through the via hole 304 in the transparent etching barrier layer 322. A first electrode 300 of the first color light emitting unit 201 includes the abovementioned transparent structure 320 and an electrode sub-layer 310 between the transparent structure 320 and the base substrate 100. A transparent structure 320 of the second color light emitting unit 202 includes a third transparent conductive layer 324 and a fourth transparent conductive layer 325 that are in contact with each other. A first electrode 300 of the second color light emitting unit 202 includes the abovementioned transparent structure 320 and an electrode sub-layer 310 between the transparent structure 320 and the base substrate 100. A transparent structure 320 of the third color light emitting unit 203 is the fifth transparent conductive layer 326, and a first electrode 300 of the third color light emitting unit 203 includes the abovementioned transparent structure 320 and an electrode sub-layer 310 between the transparent structure 320 and the base substrate 100.

As can be seen from FIG. 2I, thicknesses of transparent structures included in the light emitting units of different colors are different, during manufacturing the transparent structures having different thicknesses, the transparent etching barrier layer is provided to prevent the transparent conductive layer on a side of the transparent etching barrier layer facing the base substrate from being damaged.

For example, a thickness of the transparent structure 320 of the first color light emitting unit 201 is larger than a thickness of the transparent structure 320 of the second color light emitting unit 202, and the thickness of the transparent structure 320 of the second color light emitting unit 202 is larger than a thickness of the transparent structure 320 of the third color light emitting unit 203.

Figure 2J:
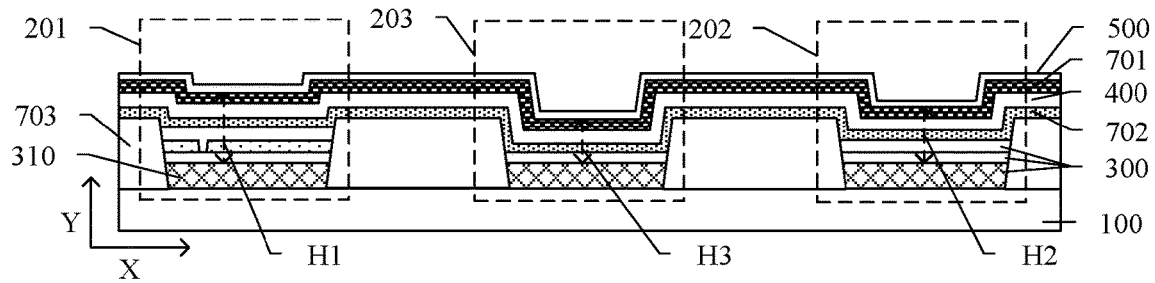

For example, the display substrate provided by the embodiment is an organic light emitting diode display substrate. This embodiment is described by taking the first electrode 300 as an anode as an example. For example, as shown in FIG. 2J, a hole transport layer 702, a light emitting layer 400, an electron transport layer 701, and a second electrode 500 are sequentially formed on a side of the first electrode 300 included in each of the light emitting units away from the base substrate 100, this embodiment is not limited thereto, and may also include film layers such as a hole blocking layer, an electron blocking layer, and the like. The light emitting layer 400 included in the display substrate provided in this embodiment is a white light emitting layer. A pixel defining layer 703 between adjacent light emitting units is shown in FIG. 2J.

For example, as shown in FIG. 2J, the light emitting layer 400 and the second electrode 500 are conformally formed on the first electrodes 300 having different thicknesses, that is, when the light emitting layer 400 and the second electrode 500 are formed, thicknesses of the light emitting layers 400 of the light emitting units of different colors are the same, and thicknesses of the second electrodes 500 of the light emitting units of different colors are also the same, however because transparent structures of the light emitting units of different colors are different, so that the distance between the second electrode 500 and a corresponding electrode sub-layer is different in different light emitting units of the at least two colors because the thicknesses of the corresponding transparent structures are different.

For example, as shown in FIG. 2J, a distance between a second electrode 500 and an electrode sub-layer 310 of the first color light emitting unit 201 is H1, a distance between a second electrode 500 and an electrode sub-layer 310 of the second color light emitting unit 202 is H1, and a distance between a second electrode 500 and an electrode sub-layer 310 of the third color light emitting unit 203 is H3, H1>H2>H3.

For example, as shown in FIG. 2J, one of the second electrode 500 and the electrode sub-layer included in the first electrode 300 is a reflective electrode, and the other of the second electrode 500 and the electrode sub-layer included in the first electrode 300 is a transflective electrode. This embodiment is described by taking a case that the second electrode 500 is a transflective electrode and the electrode sub-layer included in the first electrode 300 is a reflective electrode as an example.

For example, the second electrode and the electrode sub-layer can constitute a microcavity effect structure, light directly emitted from the light emitting layer disposed between the second electrode and the electrode sub-layer, and light reflected by the electrode sub-layer may interfere with each other in the microcavity effect structure described above; a distance between the electrode sub-layer and the second electrode can be adjusted through the transparent structure, so that the light of a specific wavelength or the light of a specific wavelength range can be enhanced, and the light of other wavelengths is weakened, thereby narrowing a luminescence spectrum of the light emitting units of different colors, furthermore improving the color purity.

For example, as shown in FIG. 2J, an optical length (a product of the effective refractive index of a medium between the second electrode and the electrode sub-layer and a thickness thereof) of film layers (for example, the light emitting layer, the hole transport layer, and the electron transport layer, etc.) between the second electrode 500 and the electrode sub-layer 310 included in the first color light emitting unit 201 is an integer multiple of a half-wavelength of a center wavelength of first color light emitted from the first color light emitting unit 201; an optical length of film layers between the second electrode 500 and the electrode sub-layer 310 included in the second color light emitting unit 202 is an integer multiple of a half-wavelength of a center wavelength of second color light emitted from the second color light emitting unit 202; and an optical length of film layers between the second electrode 500 and the electrode sub-layer 310 included in the third color light emitting unit 203 is an integer multiple of a half-wavelength of a center wavelength of third color light emitted from the third color light emitting unit 203. Therefore, the distance between the electrode sub-layer and the second electrode can be adjusted by adjusting the thickness of the transparent structure, so that the optical lengths of the film layers between the electrode sub-layers and the second electrodes included in the light emitting units of different colors satisfy the above relationship, so as to make the light having a predetermined color be enhanced, and light of other colors be weaken, thereby improving the color purity.

For example, the first color light emitting unit 201 is a blue light emitting unit, a thickness of a transparent structure included in the blue light emitting unit is 920 angstroms; the second color light emitting unit 202 is a red light emitting unit, a thickness of a transparent structure included in the red light emitting unit is 790 angstroms; and the third color light emitting unit 203 is a green light emitting unit, a thickness of a transparent structure included in the green light emitting unit is 120 angstroms.

For example, a center wavelength of blue light emitted from the blue light emitting unit is 462 nm, a center wavelength of red light emitted from the red light emitting unit is 620 nm, and a center wavelength of green light emitted from the green light emitting unit is 540 nm.

Figure 2K:
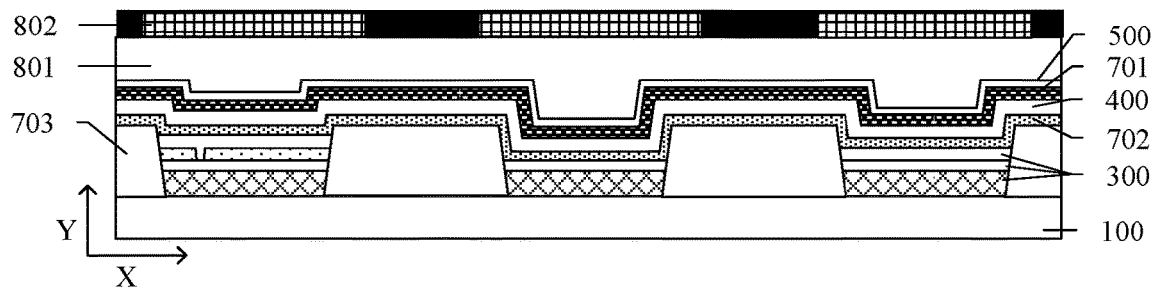

For example, as shown in FIG. 2K, a flat layer 801 is formed on a side of the second electrode 500 away from the base substrate 100, and a color film layer 802 is disposed on a side of the flat layer 801 away from the second electrode 500. The color film layer 802 includes a first filter block having a first color, a second filter block having a second color, and a third filter block having a third color, the first filter block, the second filter block, and the third filter block are disposed in one-to-one correspondence to the first color light emitting unit 201, the second color light emitting unit 202, and the third color light emitting unit 203, respectively.

The display substrate shown in this embodiment changes the original multi-wavelength white light into three primary colors of red, green and blue by adjusting the thicknesses of the transparent structures, finally the saturable three primary colors are obtained by a color filtering method, and the color filters can also slightly ameliorate the viewing angle problem.

For example, the display substrate provided in this embodiment has color gamut characteristics shown in the following table:

|  | x | y | u' | v' |
|---|---|---|---|---|
| Red light (R) | 0.682 | 0.315 | 0.5037 | 0.5234 |
| Green light (G) | 0.252 | 0.701 | 0.0924 | 0.5784 |
| Blue light (B) | 0.137 | 0.056 | 0.1613 | 0.1483 |
| White light (W) | 0.328 | 0.331 | 0.2077 | 0.4717 |
| Color gamut (NTSC) | 101.7% | | 116.3% | |

For example, the NTSC color gamut refers to a sum of colors under the NTSC standard. It can be seen from the above table that a NTSC color gamut value of RGBW is greater than 100% in the CIE 1931 xy chromaticity space, and a NTSC color gamut value of the RGBW is greater than 100% in the CIE 1976 u'v' chromaticity space, therefore, the display substrate in this embodiment has a wide color gamut performance.

For example, thicknesses of transparent structures in any two of the red light emitting unit, the green light emitting unit, and the blue light emitting unit included in this embodiment may be the same, that is, transparent structures in two different-color light emitting units of three different-color light emitting units can be manufactured by the same process, thereby saving process steps. In a case where the thicknesses of the transparent structures in any two light emitting units of the red light emitting unit, the green light emitting unit, and the blue light emitting unit are designed to be the same, the display substrate emits light of three different colors by disposing the color film layer.

For example, FIGS. 3A-3G are schematic process flow diagrams of a display substrate according to another example of an embodiment of the present disclosure.

Figure 3A:
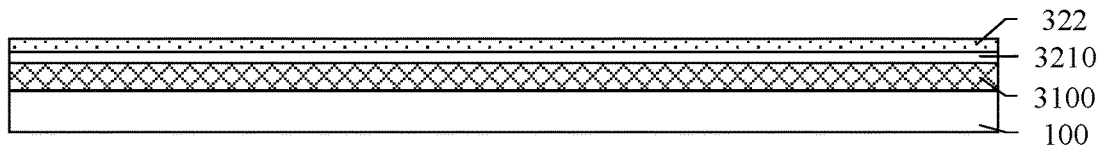
FIGS. 3A-3G are schematic process flow diagrams of a display substrate according to another example of an embodiment of the present disclosure.

For example, as shown in FIG. 3A, an electrode sub-layer material 3100, a first transparent conductive layer material 3210, and a transparent etching barrier layer 322 which are integral layers are sequentially formed on a base substrate 100. The electrode sub-layer material 3100 in this example and the electrode sub-layer material 3100 shown in FIGS.

2A-2G have the same parameters, the first transparent conductive layer material 3210 in this example and the first transparent conductive layer material 3210 shown in FIGS. 2A-2G have the same parameters, and the transparent etching barrier layer 322 in this example and the transparent etching barrier layer 322 shown in FIGS. 2A-2G have the same parameters. The electrode sub-layer material 3100 in this example is an electrode sub-layer 310.

Figure 3B:
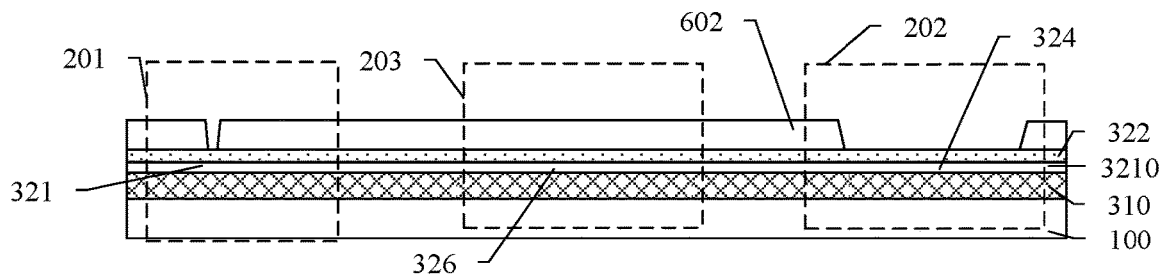
Figure 3C:
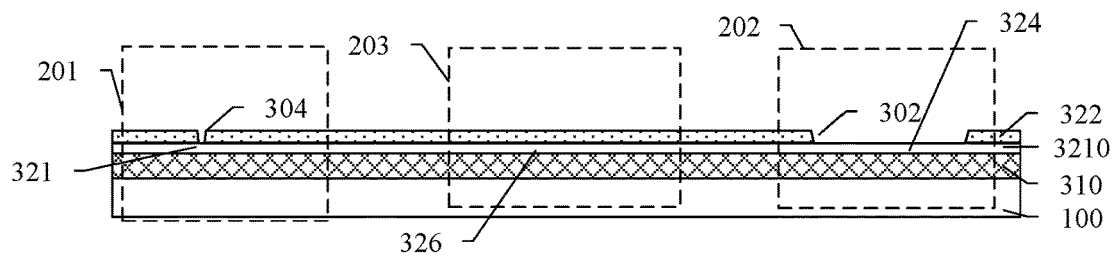

For example, as shown in FIG. 3B, a second photoresist pattern 602 is formed on the transparent etching barrier layer 322, and the transparent etching barrier layer 322 is etched by using the second photoresist pattern 602 as a mask to form an opening 302 and a via hole 304 shown in FIG. 3C in the transparent etching barrier layer 322, and then the photoresist is stripped to obtain a structure shown in FIG. 3C.

In this example, the light emitting units of the at least two colors include a first color light emitting unit, a second color light emitting unit, and a third color light emitting unit. The first transparent conductive layer material 3210 which is an integral layer in this example includes a first transparent conductive layer 321 of the first color light emitting unit 201 to be formed, a third transparent conductive layer 324 of the second color light emitting unit 202 to be formed, and a fifth transparent conductive layer 326 of the third color light emitting unit 203 to be formed. Thus, in this example, the first transparent conductive layer 321 in the first color light emitting unit 201, the third transparent conductive layer 324 in the second color light emitting unit 202, and the fifth transparent conductive layer 326 in the third color light emitting unit 203 are formed in the same process. The first transparent conductive layer 321, the third transparent conductive layer 324, and the fifth transparent conductive layer 326 in this example have the same parameters as the three transparent conductive layers shown in FIG. 2B.

For example, as shown in FIG. 3C, the opening 302 included in the transparent etching barrier layer 322 is configured to expose the third transparent conductive layer 324, and the via hole 304 included in the transparent etching barrier layer 322 is configured to expose a portion of the first transparent conductive layer 321.

Figure 3D:
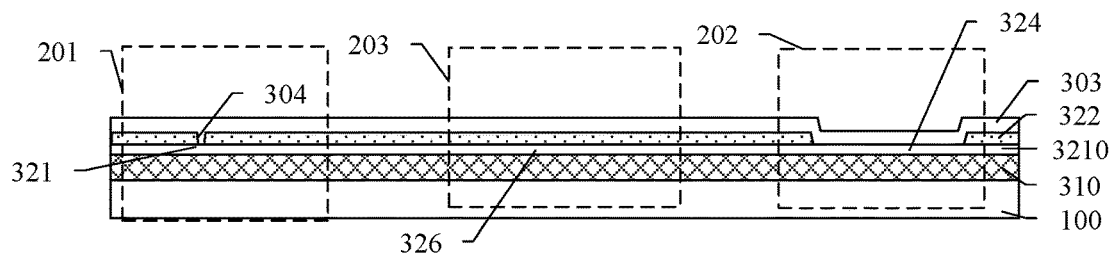

For example, as shown in FIG. 3D, a transparent conductive film 303 is formed on a side of the patterned transparent etching barrier layer 322 and the exposed third transparent conductive layer 324 away from the base substrate 100. A first portion of the transparent conductive film 303 located directly above the first transparent conductive layer 321 is electrically connected to the first transparent conductive layer 321 through the via hole 304, a second portion of the transparent conductive film 303 located directly above the third transparent conductive layer 324 is in contact with the third transparent conductive layer 324.

Figure 3E:
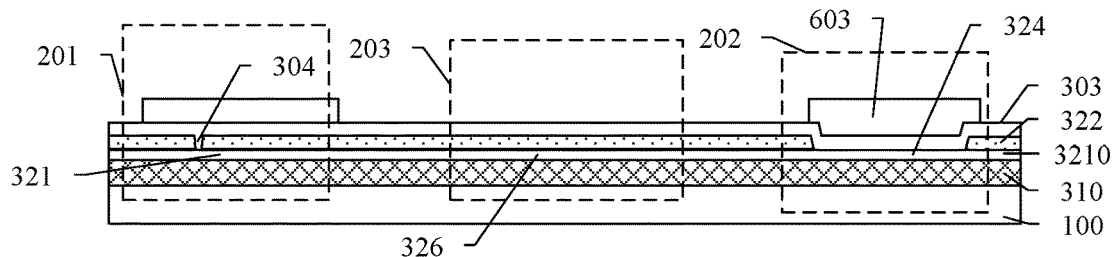
Figure 3F:
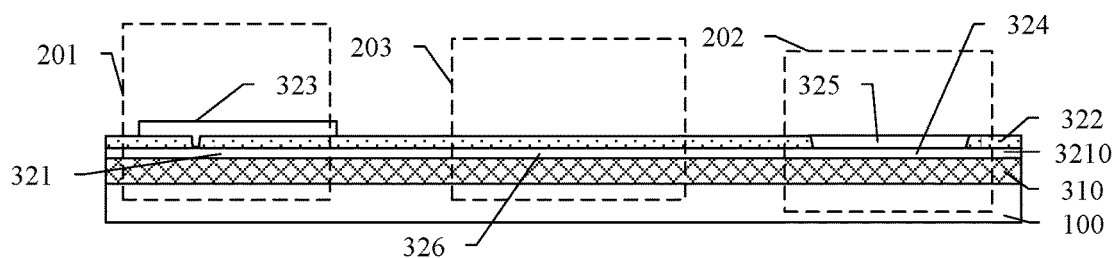

For example, as shown in FIG. 3E, a third photoresist pattern 603 is formed on the transparent conductive film 303, and the transparent conductive film 303 is etched by using the third photoresist pattern 603 as a mask to form a second transparent conductive layer 323 as shown in FIG. 3F on the first transparent conductive layer 321, a fourth transparent conductive layer 325 shown in FIG. 3F is formed on the third transparent conductive layer 324, and then the photoresist is stripped to form a structure shown in FIG. 3F.

For example, the second transparent conductive layer 323 of the first color light emitting unit 201 and the fourth transparent conductive layer 325 of the second color light emitting unit 202 are formed in the same process, for example, the second transparent conductive layer 323 of the first color light emitting unit 201 and the fourth transparent conductive layer 325 of the second color light emitting unit 202 are formed by patterning the same transparent conductive film 303 once. The second transparent conductive layer and the fourth transparent conductive layer in this example have the same parameters as the second transparent conductive layer and the fourth transparent conductive layer shown in FIG. 2H.

Because the etching rate of the transparent conductive film 303 and the etching rate of the fifth transparent conductive layer 326 are substantially the same, in this example, through providing the transparent etching barrier layer 322 between the transparent conductive film 303 and the fifth transparent conductive layer 326, the fifth transparent conductive layer 326 may be prevented from being damaged when the transparent conductive film 303 is etched. In this example, in a case of forming transparent structures of different thicknesses in the light emitting units of different colors, that is, in a process of etching the transparent conductive film to form the second transparent conductive layer and the fourth transparent conductive layer, the transparent etching barrier layer can prevent damage to the transparent conductive layer (such as, the fifth transparent conductive layer) located between the transparent etching barrier layer and the base substrate, so that a surface of the transparent conductive layer between the transparent etching barrier layer and the base substrate is relatively flat.

Figure 3G:
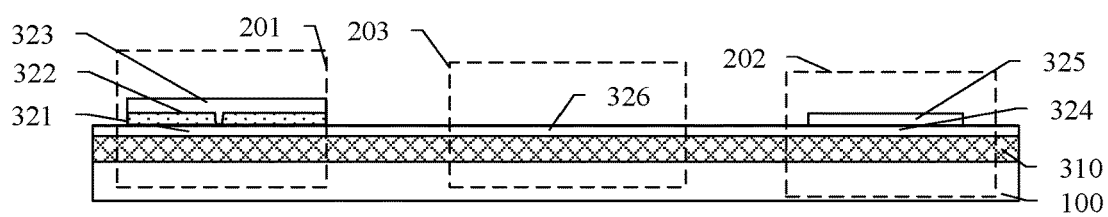

For example, as shown in FIG. 3F, the transparent etching barrier layer 322 is etched (wet etching or dry etching) to retain a portion of the transparent etching barrier layer 322 between the first transparent conductive layer 321 and the second transparent conductive layer 323, and to expose the fifth transparent conductive layer 326 shown in FIG. 3G.

The display substrate in this example is an organic light emitting diode display substrate, the first electrode is a common electrode to all of the light emitting units of different colors, therefore the step of patterning the electrode sub-layer included in the first electrode and the transparent conductive layer in contact with the electrode sub-layer is saved in this example.

For example, thicknesses of transparent structures in any two of the first color light emitting unit, the second color light emitting unit, and the third color light emitting unit included in this embodiment may be the same, that is, transparent structures in two different-color light emitting units of three different-color light emitting units can be manufactured by the same process, thereby saving process steps. In a case where thicknesses of transparent structures in any two light emitting units of the first color light emitting unit, the second color light emitting unit, and the third color light emitting unit are designed to be the same, the display substrate emits light of three different colors by disposing the color film layer.

For example, in a case where a thickness of a transparent structure in the third color light emitting unit is the same as a thickness of a transparent structure of the first color light emitting unit or the second color light emitting unit, because the first electrode can serve as the common electrode, and the transparent conductive film (including the second transparent conductive layer in the first color light emitting unit and the fourth transparent conductive layer in the second color light emitting unit) may be in contact with the first transparent conductive layer material (including the first transparent conductive layer in the first color light emitting unit and the third transparent conductive layer in the second color light emitting unit), that is, the fourth transparent conductive layer is in contact with the third transparent conductive layer in the second color light emitting unit, so that the via hole does not need to be formed in the transparent etching barrier layer directly above the first transparent conductive layer.

The subsequent steps of forming the hole transport layer, the light emitting layer, the electron transport layer, the second electrode, the flat layer, and the color filter layer are the same as those of forming film layers in FIGS. 2J-2K, and are not described herein again.

For example, another embodiment of the present disclosure provides a display substrate, the display substrate as shown in FIG. 2K is formed by a method shown in FIGS. 2A to 2K. As shown in FIGS. 2I-2K, the display substrate provided in at least one embodiment includes: a base substrate 100 and light emitting units of at least two colors on the base substrate 100, and the light emitting units of the at least two colors include a first electrode 300, a light emitting layer 400 and a second electrode 500, that are stacked, on the base substrate 100. The first electrode 300 includes an electrode sub-layer 310 and transparent structure 320 on a side of the electrode sub-layer 310 away from the base substrate 100. One of the electrode sub-layer 310 and the second electrode 500 is a reflective electrode, and the other of the electrode sub-layer 310 and the second electrode 500 is a transflective electrode, and thicknesses of transparent structures 320 in the light emitting units of the at least two colors are different such that a distance between the electrode sub-layer 310 and the second electrode 500 is different in different light emitting units of the at least two colors. The light emitting units of the at least two colors include a first color light emitting unit 201, a transparent structure 320 of the first color light emitting unit 201 includes: a first transparent conductive layer 321, a transparent etching barrier layer 322 and a second transparent conductive layer 323, that are stacked with each other, on a side of the electrode sub-layer 310 away from the base substrate 100, and an etching rate of the first transparent conductive layer 321 and an etching rate of the second transparent conductive layer 323 are substantially identical, "substantially the same" herein means that the etching rate of the first transparent conductive layer 321 and the etching rate of the second transparent conductive layer 323 are completely the same, or an etching rate difference between the etching rate of the first transparent conductive layer 321 and the etching rate of the second transparent conductive layer 323 is no more than 5%.

For example, the display substrate provided in this embodiment is an organic light emitting diode display substrate.

For example, a material of the first transparent conductive layer 321 and a material of the second transparent conductive layer 323 are the same such that the etching rate of the first transparent conductive layer 321 and the etching rate of the second transparent conductive layer 323 are the same.

For example, as shown in FIG. 2J, one of the electrode sub-layer included in the first electrode 300 and the second electrode 500 is a reflective electrode, and the other of the electrode sub-layer included in the first electrode 300 and the second electrode 500 is a transflective electrode. This embodiment is described by taking a case that the second electrode 500 is a transflective electrode and the electrode sub-layer included in the first electrode 300 is a reflective electrode as an example.

For example, the second electrode and the electrode sub-layer can constitute a microcavity effect structure, light directly emitted from the light emitting layer disposed between the second electrode and the electrode sub-layer, and light reflected by the electrode sub-layer may interfere with each other in the microcavity effect structure described above; a distance between the electrode sub-layer and the second electrode can be adjusted through the transparent structure, so that the light of a specific wavelength or the light of a specific wavelength range can be enhanced, and the light of other wavelengths is weakened, thereby narrowing a luminescence spectrum of the light emitting units of different colors, furthermore improving the color purity.

For example, a material of the first transparent conductive layer 321 and a material of the second transparent conductive layer 323 both include indium tin oxide, gallium zinc oxide, zinc oxide, or indium zinc oxide, and a material of the transparent etching barrier layer 322 includes silicon oxide, silicon nitride or silicon oxynitride.

For example, a thickness of the first transparent conductive layer 321 is 80-300 angstroms, a thickness of the transparent etching barrier layer 322 is 80-500 angstroms, and a thickness of the second transparent conductive layer 323 is 120-900 angstroms.

For example, as shown in FIGS. 2I-2K, the light emitting units of the at least two colors further include a second color light emitting unit 202, a transparent structure of the second color light emitting unit 202 includes a third transparent conductive layer 324 and a fourth transparent conductive layer 325 which are stacked and in contact with each other, a thickness of the third transparent conductive layer 324 is the same as a thickness of the first transparent conductive layer 321, a material of the third transparent conductive layer 324 is the same as a material of the first transparent conductive layer 321, a thickness of the fourth transparent conductive layer 325 is the same as a thickness of the second transparent conductive layer 323, and a material of the fourth transparent conductive layer 325 is the same as a material of the second transparent conductive layer 323. That is, the first transparent conductive layer 321 of the first color light emitting unit 201 and the third transparent conductive layer 324 of the second color light emitting unit 202 are formed in the same process, and the second transparent conductive layer 323 of the first color light emitting unit 201 and the fourth transparent conductive layer 325 of the second color light emitting unit 202 are formed in the same process.

For example, as shown in FIGS. 2I-2K, the light emitting units of the at least two colors further include a third color light emitting unit 203, and a transparent structure of the third color light emitting unit 203 includes a fifth transparent conductive layer 326, a thickness of the fifth transparent conductive layer 326 is the same as a thickness of the first transparent conductive layer 321, and a material of the fifth transparent conductive layer 326 is the same as a material of the first transparent conductive layer 323. That is, the first transparent conductive layer 321 of the first color light emitting unit 201, the third transparent conductive layer 324 of the second color light emitting unit 202, and the fifth transparent conductive layer 326 of the third color light emitting unit 203 are formed in the same process.

In this embodiment, in a process of forming transparent structures of different thicknesses in the light emitting units of different colors, that is, in a process of forming the second transparent conductive layer and the fourth transparent conductive layer by an etching process, the transparent etching barrier layer can prevent damage to the transparent conductive layer located between the transparent etching barrier layer and the base substrate, for example, the transparent etching barrier layer can prevent damage to the fifth transparent conductive layer, so that a surface of the formed fifth transparent conductive layer is relatively flat.

For example, the first color light emitting unit 201 is a blue light emitting unit, a thickness of a transparent structure included in the blue light emitting unit is 920 angstroms; the second color light emitting unit 202 is a red light emitting unit, a thickness of a transparent structure included in the red light emitting unit is 790 angstroms; and the third color light emitting unit 203 is a green light emitting unit, a thickness of a transparent structure included in the green light emitting unit is 120 angstroms.

For example, a center wavelength of blue light emitted from the blue light emitting unit is 462 nm, a center wavelength of red light emitted from the red light emitting unit is 620 nm, and a center wavelength of green light emitted from the green light emitting unit is 540 nm.

For example, as shown in FIG. 2K, the display substrate further includes a flat layer 801 on a side of the second electrode 500 away from the base substrate 100, and a color film layer 802 on a side of the flat layer 801 away from the second electrode 500. The color film layer 802 includes a first filter block having a first color, a second filter block having a second color, and a third filter block having a third color. The first filter block, the second filter block, and the third filter block are disposed in one-to-one correspondence to the first color light emitting unit 201, the second color light emitting unit 202, and the third color light emitting unit 203, respectively.

The light emitting layer in the display substrate provided in this embodiment is a white light emitting layer, the display substrate shown in this embodiment changes the original multi-wavelength white light into three primary colors of red, green and blue by adjusting the thicknesses of the transparent structures, finally the saturable three primary colors are obtained by a color filtering method, and the color filters can also slightly ameliorate the viewing angle problem.

For example, thicknesses of transparent structures in any two of the red light emitting unit, the green light emitting unit, and the blue light emitting unit included in this embodiment may be the same, that is, transparent structures in two different-color light emitting units of three different-color light emitting units can be set identically, thereby saving process steps. In a case where the thicknesses of the transparent structures in any two light emitting units of the red light emitting unit, the green light emitting unit, and the blue light emitting unit are designed to be the same, the display substrate emits light of three different colors by disposing the color film layer.

Another embodiment of the present disclosure provides a display device, and the display device includes the display substrate in any one of the above embodiments. In a process of forming the display device including the display substrate in any one of the above embodiments, because the etching rate of the first transparent conductive layer and the etching rate of the second transparent conductive layer are substantially the same, by forming the transparent etching barrier layer, damage to the transparent conductive layer on the side of the transparent etching barrier layer facing the base substrate can be prevented when forming the transparent structures having different thicknesses in the light emitting units of different colors.

For example, the display device may be a display component such as an organic light emitting diode (OLED) and may include any products or components including the display device and having a display function such as: a television, a digital camera, a mobile phone, a watch, a tablet, a notebook computer, a navigator, and the like, and the embodiments are not limited thereto.

The following is to be noted:

(1) the accompanying drawings involve only the structure (s) in connection with the embodiment(s) of the present disclosure, and other structure(s) can be referred to in common design(s); and (2) in case of no conflict, features in the same embodiment and different embodiments of the present disclosure can be combined with each other.

What have been described above are only exemplary implementations of the present disclosure, the protection scope of the present disclosure is not limited thereto, and the protection scope of the present disclosure should be based on the protection scope of the claims.

What is claimed is:

1. A manufacturing method of a display substrate, comprising:

forming light emitting units of at least two colors on a base substrate, forming the light emitting units of the at least two colors comprising:

forming a first electrode on the base substrate;

forming a light emitting layer on a side of the first electrode away from the base substrate; and forming a second electrode on a side of the light emitting layer away from the first electrode, wherein forming the first electrode comprises sequentially forming an electrode sub-layer and a transparent structure on the base substrate;

one of the electrode sub-layer and the second electrode is a reflective electrode, the other of the electrode sub-layer and the second electrode is a transflective electrode, and thicknesses of transparent structures in the light emitting units of the at least two colors are different such that a distance between the electrode sub-layer and the second electrode is different in different light emitting units of the at least two colors;

the light emitting units of the at least two colors comprise a first color light emitting unit, and forming the transparent structure of the first color light emitting unit comprises: sequentially forming a first transparent conductive layer, a transparent etching barrier layer and a second transparent conductive layer, that are stacked with each other, on a side of the electrode sub-layer of the first color light emitting unit away from the base substrate, an etching rate of the first transparent conductive layer and an etching rate of the second transparent conductive layer being substantially identical.

2. The manufacturing method of the display substrate according to claim 1, wherein the light emitting layer and the second electrode are conformal structures formed on the transparent structures having different thicknesses.

3. The manufacturing method of the display substrate according to claim 1, wherein the light emitting units of the at least two colors further comprise a second color light emitting unit, the transparent structure of the second color light emitting unit comprises a third transparent conductive layer and a fourth transparent conductive layer which are stacked and in contact with each other, and forming the transparent structure of the first color light emitting unit and the transparent structure of the second color light emitting unit comprises:

forming the first transparent conductive layer and the third transparent conductive layer in a same process;

forming the transparent etching barrier layer on a side of the first transparent conductive layer and a side of the third transparent conductive layer away from the base substrate, and patterning the transparent etching barrier layer to form an opening exposing the third transparent conductive layer;

forming a transparent conductive film on a side of the transparent etching barrier layer that is patterned and a side of the third transparent conductive layer away from the base substrate, wherein a first portion of the transparent conductive film directly above the first transparent conductive layer is the second transparent conductive layer, and a second portion of the transparent conductive film directly above the third transparent conductive layer is the fourth transparent conductive layer.

4. The manufacturing method of the display substrate according to claim 3, wherein forming the first transparent conductive layer and the third transparent conductive layer in the same process comprises:

forming the first transparent conductive layer and the third transparent conductive layer that are spaced apart from each other by using a same patterning process;

after forming the transparent conductive film, the manufacturing method comprises:

patterning the transparent conductive film and the transparent etching barrier layer that is patterned, to retain a first portion of the transparent etching barrier layer on the first transparent conductive layer, forming the second transparent conductive layer on the first portion of the transparent etching barrier layer that is retained, and forming the fourth transparent conductive layer on the third transparent conductive layer.

5. The manufacturing method of the display substrate according to claim 3, wherein the light emitting units of the at least two colors further comprise a third color light emitting unit, and the transparent structure of the third color light emitting unit comprises a fifth transparent conductive layer, while forming the first transparent conductive layer and the third transparent conductive layer, the manufacturing method further comprises: forming the fifth transparent conductive layer, while forming the second transparent conductive layer and the fourth transparent conductive layer, the manufacturing method further comprises: removing a second portion of the transparent etching barrier layer and a third portion of the transparent conductive film on the fifth transparent conductive layer to expose the fifth transparent conductive layer, the transparent etching barrier layer being configured to prevent the fifth transparent conductive layer from being etched.

6. The manufacturing method of the display substrate according to claim 3, wherein while patterning the transparent etching barrier layer to form an opening, the manufacturing method further comprises: forming a via hole penetrating the transparent etching barrier layer in the transparent etching barrier layer on the first transparent conductive layer to electrically connect the second transparent conductive layer to be subsequently formed with the first transparent conductive layer.

7. The manufacturing method of the display substrate according to claim 3, wherein the transparent etching barrier layer is formed by a chemical vapor deposition method.

8. The manufacturing method of the display substrate according to claim 1, wherein the light emitting layer is a white light emitting layer.

9. The manufacturing method of the display substrate according to claim 1, wherein a material of the first transparent conductive layer and a material of the second transparent conductive layer comprise indium tin oxide, gallium zinc oxide, zinc oxide or indium zinc oxide, and a material of the transparent etching barrier layer comprises silicon oxide, silicon nitride or silicon oxynitride.

10. The manufacturing method of the display substrate according to claim 9, wherein the material of the first transparent conductive layer and the material of the second transparent conductive layer are identical.

11. The manufacturing method of the display substrate according to claim 1, wherein a thickness of the first transparent conductive layer is 80-300 angstroms, a thickness of the transparent etching barrier layer is 80-500 angstroms, and a thickness of the second transparent conductive layer is 120-900 angstroms.

12. A display substrate, comprising:

a base substrate;

light emitting units of at least two colors on the base substrate, wherein the light emitting units of the at least two colors comprise a first electrode, a light emitting layer and a second electrode, that are stacked, on the base substrate, the first electrode comprises an electrode sub-layer and a transparent structure on a side of the electrode sub-layer away from the base substrate, one of the electrode sub-layer and the second electrode is a reflective electrode, the other of the electrode sub-layer and the second electrode is a transflective electrode, and thicknesses of transparent structures in the light emitting units of the at least two colors are different such that a distance between the electrode sub-layer and the second electrode is different in different light emitting units of the at least two colors;

wherein the light emitting units of the at least two colors comprise a first color light emitting unit, the transparent structure of the first color light emitting unit comprises:

a first transparent conductive layer, a transparent etching barrier layer and a second transparent conductive layer, that are stacked with each other, on a side of the electrode sub-layer away from the base substrate, and an etching rate of the first transparent conductive layer and an etching rate of the second transparent conductive layer being substantially identical.

13. The display substrate according to claim 12, wherein the light emitting units of the at least two colors further comprise a second color light emitting unit, the transparent structure of the second color light emitting unit comprises a third transparent conductive layer and a fourth transparent conductive layer which are stacked and in contact with each other, the third transparent conductive layer and the first transparent conductive layer are formed in a same process, and the fourth transparent conductive layer and the second transparent conductive layer are formed in a same process.

14. The display substrate according to claim 13, wherein the light emitting units of the at least two colors further comprise a third color light emitting unit, the transparent structure of the third color light emitting unit comprises a fifth transparent conductive layer, and the fifth transparent conductive layer and the first transparent conductive layer are formed in a same process.

15. The display substrate according to claim 12, wherein a material of the first transparent conductive layer and a material of the second transparent conductive layer comprise indium tin oxide, gallium zinc oxide, zinc oxide or indium zinc oxide, and a material of the transparent etching barrier layer comprises silicon oxide, silicon nitride or silicon oxynitride.

16. The display substrate according to claim 15, wherein the material of the first transparent conductive layer and the material of the second transparent conductive layer are identical.

17. The display substrate according to claim 12, wherein the transparent etching barrier layer comprises a via hole penetrating the transparent etching barrier layer to electrically connect the second transparent conductive layer with the first transparent conductive layer.

18. The display substrate according to claim 12, wherein the light emitting layer is a white light emitting layer, and the display substrate further comprises a color film layer on a side of the light emitting units away from the base substrate.

19. A display device, comprising the display substrate according to claim 12.

* * * * *